(12) United States Patent
George et al.

(10) Patent No.: US 7,947,605 B2
(45) Date of Patent: May 24, 2011

(54) POST ION IMPLANT PHOTORESIST STRIP USING A PATTERN FILL AND METHOD

(75) Inventors: Rene George, San Jose, CA (US); Stephen E. Savas, Fremont, CA (US)

(73) Assignee: Mattson Technology, Inc., Fremont, CA (US)

( * ) Notice: Subject to any disclaimer, the term of this patent is extended or adjusted under 35 U.S.C. 154(b) by 1043 days.

(21) Appl. No.: 11/736,727

(22) Filed: Apr. 18, 2007

(65) Prior Publication Data

US 2007/0287291 A1 Dec. 13, 2007

Related U.S. Application Data

(60) Provisional application No. 60/793,264, filed on Apr. 19, 2006.

(51) Int. Cl.
*H01L 21/302* (2006.01)

(52) U.S. Cl. ........ 438/694; 438/689; 438/706; 438/692; 257/E21.255; 257/E21.579

(58) Field of Classification Search .............. 438/689, 438/706, 694, 692; 257/E21.255, E21.779
See application file for complete search history.

(56) References Cited

U.S. PATENT DOCUMENTS

| | | | |
|---|---|---|---|
| 4,861,424 A | 8/1989 | Fujimura et al. | |
| 5,811,022 A | 9/1998 | Savas et al. | |
| 5,824,604 A | 10/1998 | Bar-Gadda | |
| 6,143,129 A | 11/2000 | Savas et al. | |
| 6,379,576 B2 | 4/2002 | Luo et al. | |
| 6,551,447 B1 | 4/2003 | Savas et al. | |
| 6,805,139 B1 | 10/2004 | Savas et al. | |
| 7,361,605 B2 | 4/2008 | Savas et al. | |
| 7,799,685 B2 | 9/2010 | Savas et al. | |
| 2006/0046482 A1* | 3/2006 | Verhaverbeke | 438/689 |
| 2009/0011615 A1 | 1/2009 | Diao et al. | |

* cited by examiner

*Primary Examiner* — Nadine G Norton
*Assistant Examiner* — Mahmoud Dahimene
(74) *Attorney, Agent, or Firm* — Pritzkau Patent Group, LLC

(57) ABSTRACT

A method is described for use in a system that removes an implant crust that is formed as an outermost layer of photoresist in a photoresist pattern that is supported by a workpiece. The photoresist pattern defines apertures which lead to an active device region. The active device region is formed by an ion implantation which produces the implant crust. A filler material is applied such that the filler material reaches a fill depth in each aperture. The workpiece and the filler material are exposed to a treatment environment to remove the implant crust on the laterally extending surface of the photoresist as the filler material protects the active device region. Thereafter, a remaining portion of the photoresist layer is removed. An associated intermediate assembly, including the workpiece, is described.

29 Claims, 11 Drawing Sheets

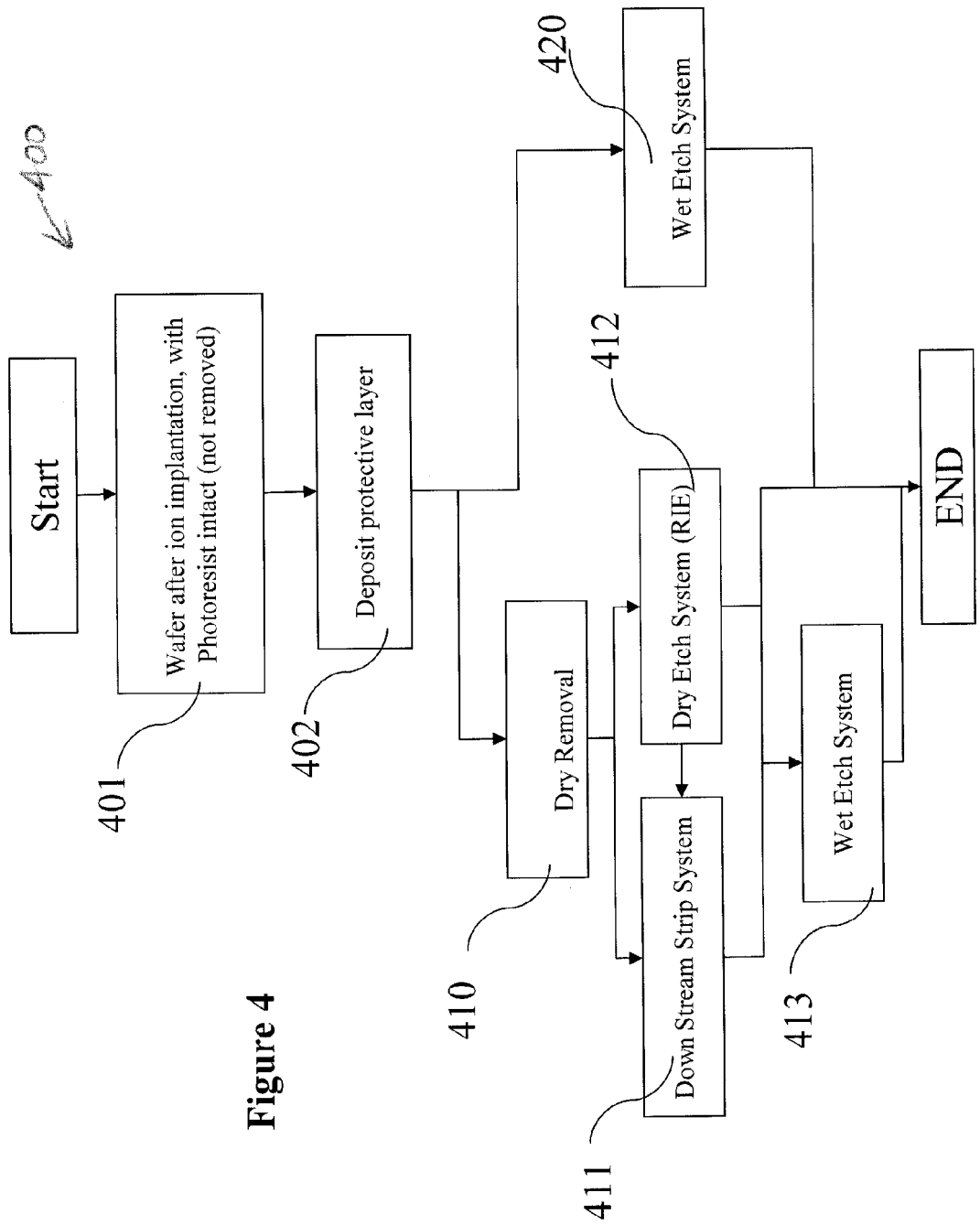

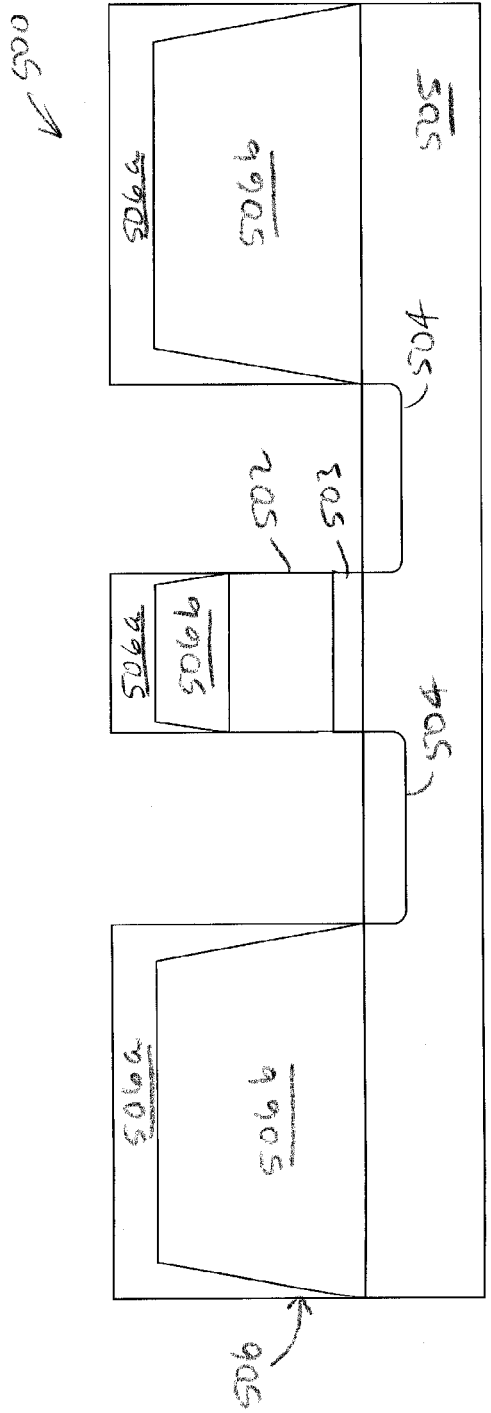
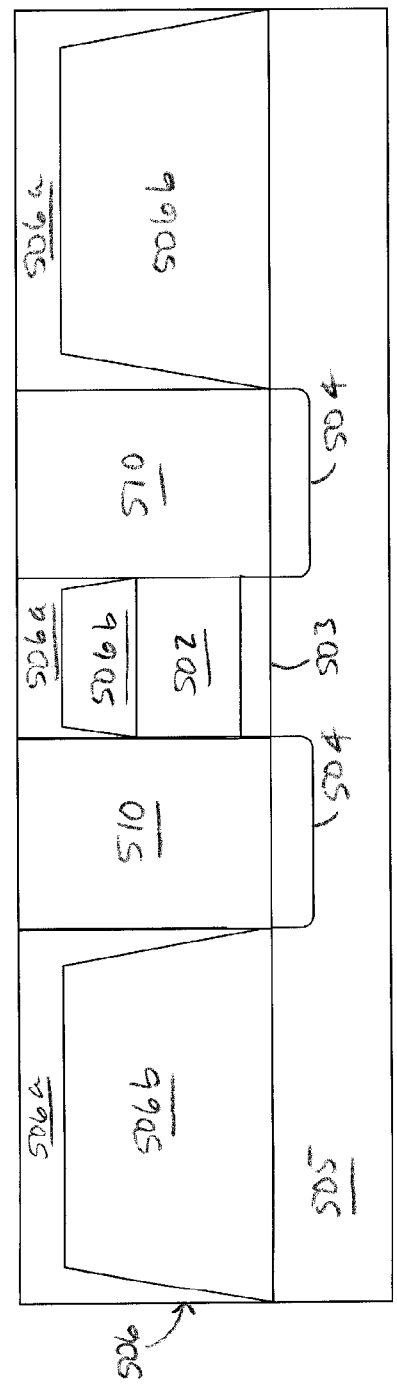
Figure 5a
Figure 5b

POST ION IMPLANT PHOTORESIST STRIP USING A PATTERN FILL AND METHOD

RELATED APPLICATION

The present application claims priority from U.S. Provisional Patent Application Ser. No. 60/793,264, filed on Apr. 19, 2006 which is incorporated herein by reference in its entirety.

BACKGROUND AND DEVELOPMENT

The present invention is related generally to semiconductor fabrication and, more particularly, to a method for removal of photoresist and residues following high dose ion implantation.

The photoresist (PR) stripping applications that will soon be used in the early stages of IC fabrication, just following ion implantation are specialized and difficult. Leading edge logic devices at the 65 nm technology node and beyond may have 15 or more high dose implanted (HDI) photoresist removal steps. The most critical of these stripping processes are those performed after high dose ion implantation into the junctions—which will be extremely shallow (ultra shallow junctions—or USJ). In many cases, six or more of the high dose implantation steps will be performed to form junctions for transistors in fast logic ICs. During the ensuing stripping/cleaning processes of the implanted photoresist, these areas of the silicon surface are often exposed to aggressive plasma chemistries. Also critical will be a few other implanted photoresist removal and cleaning processes that will be performed with gate electrodes exposed—especially at about the 45 nm technology node and below, when gates will be made of metals or metal silicide. Of course, all junctions are exposed during wet chemical cleaning processes that virtually always follow the dry stripping processes.

Recently, we have found that the combination of even the most non-damaging dry stripping processes with even the softest wet cleaning processes which are needed to fully remove crust, photoresist and residues, cause loss or oxidation of silicon at transistor junctions beyond the acceptable limit for 45 nm devices (as listed in the International Technology Roadmap for Semiconductors—ITRS). It is submitted that current PR stripping, residue removal or surface treatment processes for these applications will be inadequate to meet all process requirements for future device nodes, as the size of transistors continues to shrink and the thickness of critical silicon layers on the wafer surface continues to decrease.

One important reason is recognized to be the difficulty in complete removal of the PR where the top layer of the PR has been subjected to very substantial ion bombardment (during ion implant doping) that causes most hydrogen in the polymer to be lost and the carbon in the polymer to cross-link. The toughness of the top layer of the implanted PR (implant crust) is well known, and makes it highly resistant to the chemical attack that is commonly used to strip the photoresist. The physical structure of the resist after high dose ion implantation is shown in FIG. 1, generally indicated by the reference number 100. A first layer 101 is a hardened "crust" which received most of the ion dose when it was used as a mask during implantation. Research has shown that the crust is a graphitic, highly cross-linked, and predominantly a carbon polymer when the dose of ions is equal to or greater than $10^{15}$ per centimeter squared. Typically, the implanted ion energy is such that the ions do not penetrate more than a fraction of the thickness of the photoresist mask. Consequently, the ion-damaged crust is only a fraction of the thickness of the photoresist. The remaining PR (so called "bulk"), which has not been ion implanted, is indicated by the reference number 102. It can be seen that the crust and the bulk PR contact silicon 103, with the crust partially or completely enveloping the bulk.

Because of the hardness and low reactivity of the PR crust material, the dopants in the crust and the tendency of normal stripping processes to cause particulate contamination on the wafer, processes for removing high dose implanted PR are very difficult. Historically, because of the toughness of the implanted crust, and the fact that the crust contains dopant atoms and some silicon on its sidewalls, the first one or two removal steps are performed with plasma-based dry stripping systems, while the final cleaning step for removing residues remaining after stripping is often performed with strong aqueous chemicals—usually in chemical baths. During such processes it has been normal for a modest amount of the silicon dioxide surface material covering the junctions of transistors to be lost. However, recent advances in integrated circuit technology require preservation of the ion implanted dopants at the top layers of the junctions, and as a result it is thought that the sacrificial oxide layer that has been used in most device generations to protect junctions can not be used in future technology nodes.

A schematic of a standard configuration of a downstream plasma-based PR stripping chamber and source is shown in FIG. 2, generally indicated by the reference number 200. Gas coming from a set of flow controllers and valves 201, passes via tubing 202 to a plasma source 203. There, the gas becomes substantially dissociated (and partially ionized) and then goes through a distribution/baffling system 204 into a wafer process enclosure 205. A pedestal 206 holds a wafer 207 that is to be stripped of PR and residues. On the wafer, radicals react with the PR and residues to form volatile or water-soluble reaction products that are then pumped out by ducts 208 or later rinsed off the wafer. This type of PR stripping chamber is widely used because it provides almost entirely neutral reactive species to strip the PR and does not subject the wafer to large amounts of charged particles, especially energetic ones that might damage the sensitive materials and layers used in making the integrated circuits. Such stripping systems are generally used for removing PR during the early stages of IC fabrication, when the transistors are fabricated. Removal of photoresist following high dose ion implantation is much slower and more difficult due to the implanted and slowly-reacting carbon-based crust layer that covers and protects the volume of bulk photoresist that did not receive much or any ion implantation damage. It should be appreciated that system 200 is readily adaptable for purposes of implementing a wide range of processing conditions, including those yet to be described.

In order to strip the photoresist with high productivity in a plasma-based downstream dry stripping process it is usually desirable to make the wafer temperature as high as possible (~200 C. to 250 C.) so as to increase reaction rates and consequently the stripping rate (to achieve high throughput and productivity). However, for implanted photoresist, the implanted crust has only very slow chemical reactions with reactive radicals, as compared with non-implanted photoresist. When wafers are stripped following high dose implant (HDI) in a high-temperature (>150 Celsius) conventional dry stripping process, rupture ("popping") of the photoresist crust may occur, causing higher than desirable particulate and defect levels on the wafer. In this "popping", the high temperature is believed to cause solvents contained in the bulk resist to go into the gas phase and pressure to build up underneath the crust. When the pressure builds sufficiently, it causes the hardened crust to rupture or detach from the bulk PR as it vents the built-up pressure. In conventional high temperature stripping of such HDI PR, popping is tolerated. Once the crust pops, the exposed bulk PR quickly etches in standard oxygen-based stripping processes—normally performed with wafer temperatures between 200 Celsius and 300 Celsius. Most fragments of crust are consumed in the dry stripping process but most of those that remain are physically and chemically removed by a wet bath clean. However, some such fragments are hard to remove by normal wet cleaning and cause excessive defect levels and resulting loss of IC yield. However, if the process temperature is reduced below about 120 C. to 140 C. to avoid popping, then the low reactivity of the crust can cause the process to take an extremely long time—up to tens of minutes—which is very expensive due to its reduction of stripping system productivity. This is unacceptable for the economics of IC devices, which must increasingly go into affordable consumer products.

Since the hardened crust, unlike bulk PR, is very hard to strip even with the most reactive radicals such as atomic oxygen, and especially so at low enough temperatures to eliminate popping, other means of activation of chemical reactions have been found to activate reactions—such as described in U.S. Pat. No. 4,861,424 to Fujimura (hereinafter the '424 patent) and U.S. Pat. No. 6,805,139 to Savas et al. Generally, ion bombardment in an etching type of system is used to etch the top crust of the photoresist at low temperature (<120 C.) and then a higher temperature downstream, thermal activation type of stripping step, and/or conventional wet cleaning method is used to remove the remaining photoresist, sidewall crust and residues. A frequent second step to remove much or all of the remaining bulk PR (which has not been chemically altered during the ion implantation) may be performed at higher wafer temperature (normally at least 200 Celsius) than the crust etching step—to speed up the etching rate. Thus, after the crust is breached, there is no further danger of popping, since pressure cannot build up, and the temperature may be higher. At this stage, the bulk PR is accessible to the gas phase species and such photoresist, not altered by ion implantation, quickly etches chemically. This step is very similar to normal PR stripping applications, since the under layer of photoresist has been substantially unchanged by the patterning or doping process.

However, the stripping of the bulk photoresist is not normally the final step, due to the significant side effects of ion implantation. Very often, difficult to remove residues remain after removing most of the crust and all the bulk PR. Such residues are usually made up of the remnants of the implanted resist crust (carbon polymer, dopants and silicon oxide). Usually, silicon compounds are found mostly on the sidewalls of the photoresist, whereas most dopants are found inside the crust. The ion implantation process always causes some silicon dioxide or silicon exposed on the wafer surface to be sputtered. Such sputtered silicon will, in part, strike and condense on the sidewalls or top of the photoresist structures, leaving one or more monolayers of silicon or silicon dioxide on the outer surface of the sidewall crust. This material does not normally (especially in oxygen-based stripping) chemically convert to loose and soluble form during the bulk resist step and may be chemically quite resistant. Therefore, a necessary final step in removal of implanted PR is often the residue removal step. This may or may not be performed in the same system as the first two steps because it may in part require use of wet chemicals including strong acids or bases. When it is performed in part in the same system used for crust and bulk stripping, it usually involves the use of gas additives to the normal oxygen gas injected into the plasma source. Common additives are fluorinated gases as well as mixtures containing nitrogen and/or hydrogen, particularly "forming gas" (FG) which is at least 90% nitrogen or noble inert gas and the remainder hydrogen. Such additives help to convert the residues to a water-soluble form that will be removed by a deionized (DI) water rinse. It is common for such residue removal steps to still leave some un-reacted residues that are not even removed in a subsequent DI water rinse. Such remnant residues will need to be removed by a wet chemical treatment since the wafers need to be completely clean prior to the following process, high temperature thermal annealing of the dopant in the silicon.

High dose implanted PR crust etching using hydrogen-containing gas mixtures (mainly forming gas which is often a mixture of 3% to 5% hydrogen in nitrogen), rather than oxygen was first performed prior to the sub-micron semiconductor technology era in a few factories (Fujimura—previously cited). Conventional reactive ion etching systems (RIE) using Forming Gas were found to be capable of removing the hardened crust on the PR surface formed by high dose ion implantation, at low wafer temperatures to avoid "popping". The ion-based stripping treatment reduced the number of particulate defects found on the wafer surface following stripping of the implanted PR. In particular, when the RIE systems used this gas mixture they successfully removed the crust (without throwing off particulates by "popping") so that a following softer step, usually employing a flow of oxygen radicals could then remove the remaining bulk PR. This process worked for IC fabrication technology of that era because the bombardment of the wafer by energetic ions from the plasma provided energy to activate chemical reactions of radicals with the carbon polymer of the crust. This was performed at low temperature to avoid popping which avoided the pervasive problem of particle contamination on the wafer. It is believed that such processes cause sputter loss of several to ten angstroms of silicon dioxide from the screen (sacrificial) layer, as well as implantation of hydrogen and nitrogen between fifty and one hundred Angstroms into the wafer surface. At that time, thickness of silicon dioxide screen layers above the silicon of the junctions were on the order of 100 Angstroms thick, protecting the sensitive silicon from damage or loss due to sputtering or implantation of hydrogen or nitrogen atoms from the stripping process. As no such protection is possible with current and future generations of ICs, there remains a need for photoresist stripping processes that do not significantly remove, damage or oxidize the silicon in the very thin junction areas. It has been found that known stripping processes for implanted photoresist, whether employing downstream neutral radicals for processing wafers at elevated temperatures or utilizing ion-bombardment in a first step at lower temperature by themselves or when combined with wet cleaning processes for removing residues, result in unacceptable silicon loss from the ultra shallow transistor junctions.

More recently, using soft ion bombardment of wafers at lower temperatures, mainly with oxygen ions, has been proposed as a method for removing the crust of implanted photoresist. This method is employed as a first step in the total removal of the photoresist. It is typically followed by a downstream oxygen-radical-based conventional stripping process at higher temperatures, which removes the remaining photoresist. Water rinsing of the wafer or other soft wet cleaning may then be employed to remove the residual inorganic ash remaining after such combined treatment. Applicants have found, as will be further described below, that even the lowest energy ion treatment with molecular oxygen ions causes ion damage and some oxygen ion implantation into the silicon to a depth such that 3 or more monolayers (~>9 Angstroms) of silicon are damaged by such ion action. Applicants have further found that the ensuing wet cleaning, even with dilute chemicals at low temperatures, causes increased etching of the silicon dioxide from the surface due to the ion damage that may have been caused by the dry etching process. This results in increased oxidation of silicon under the pre-existing silicon dioxide layer by any later wet cleaning process. Consequently, we find that any such stripping process when combined with wet cleaning processes, whether for that layer of photoresist or a later-applied layer, will cause oxidation of (and eventual loss) of more than the acceptable limit, roughly 8 Angstroms to 10 Angstroms (approximately 8-10 Angstroms of total silicon loss is acceptable at approximately the 32 nm device node), of silicon at the surface of the ultra shallow junctions for transistors on the wafer surface.

The foregoing examples of the related art and limitations related therewith are intended to be illustrative and not exclusive. Other limitations of the related art will become apparent to those of skill in the art upon a reading of the specification and a study of the drawings.

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Generally, a method is described for use in a system that removes an implant crust that is formed as an outermost layer of photoresist in a photoresist pattern that is supported by a treatment object. The photoresist pattern defines a plurality of apertures each of which includes a sidewall that leads to an active device region. The active device region is formed responsive to exposure of the treatment object to an ion implant which introduces an implanted dopant into the active device region of the treatment object as well as into he photoresist, thereby producing the implant crust. The implant crust is formed on the sidewall as well as on an uppermost, laterally extending surface of the layer of photoresist between the sidewalls of the apertures. A filler material is applied to the treatment object such that the filler material reaches a fill depth in each aperture. The treatment object and the filler material are exposed to a treatment environment that cooperates with the filler material such that at least the implant crust on the laterally extending surface of the photoresist is removed as the filler material protects the active device region of the aperture from the treatment environment. Thereafter, a remaining portion of the photoresist layer is removed.

In another aspect of the disclosure, an intermediate assembly, which includes a workpiece, is described for use in a system. The system produces an active device structure in the workpiece. The intermediate assembly includes a patterned layer of photoresist formed on the workpiece, which photoresist pattern defines a plurality of apertures, each of which includes a sidewall that leads to an active device region of the workpiece. The active device region is formed responsive to exposure of the workpiece to an ion implant which introduces an implanted dopant into the active device region of the workpiece as well as into the photoresist, thereby producing the implant crust. The implant crust is formed on the sidewall as well as on an upppermost, laterally extending surface of the layer of photoresist between the sidewalls of the apertures. A filler material is applied to the treatment object such that the filler material reaches a fill depth in each aperture for protecting the active device region at least during subsequent removal of the laterally extending surface of the layer of photoresist.

BRIEF DESCRIPTIONS OF THE DRAWINGS

Exemplary embodiments are illustrated in referenced figures of the drawings. It is intended that the embodiments and figures disclosed herein are to be illustrative rather than limiting.

FIG. 4 is a flow diagram that represents one embodiment for removal of implant crust and underlying photoresist.

FIG. 5a is a diagrammatic representation, in elevation, of the cross section of a wafer and associated layers prior to deposition of a protective layer.

FIG. 5b is a diagrammatic representation, in elevation, of the cross section of the wafer and associated layers after deposition of a single protective layer.

DETAILED DESCRIPTION

Figure 1:
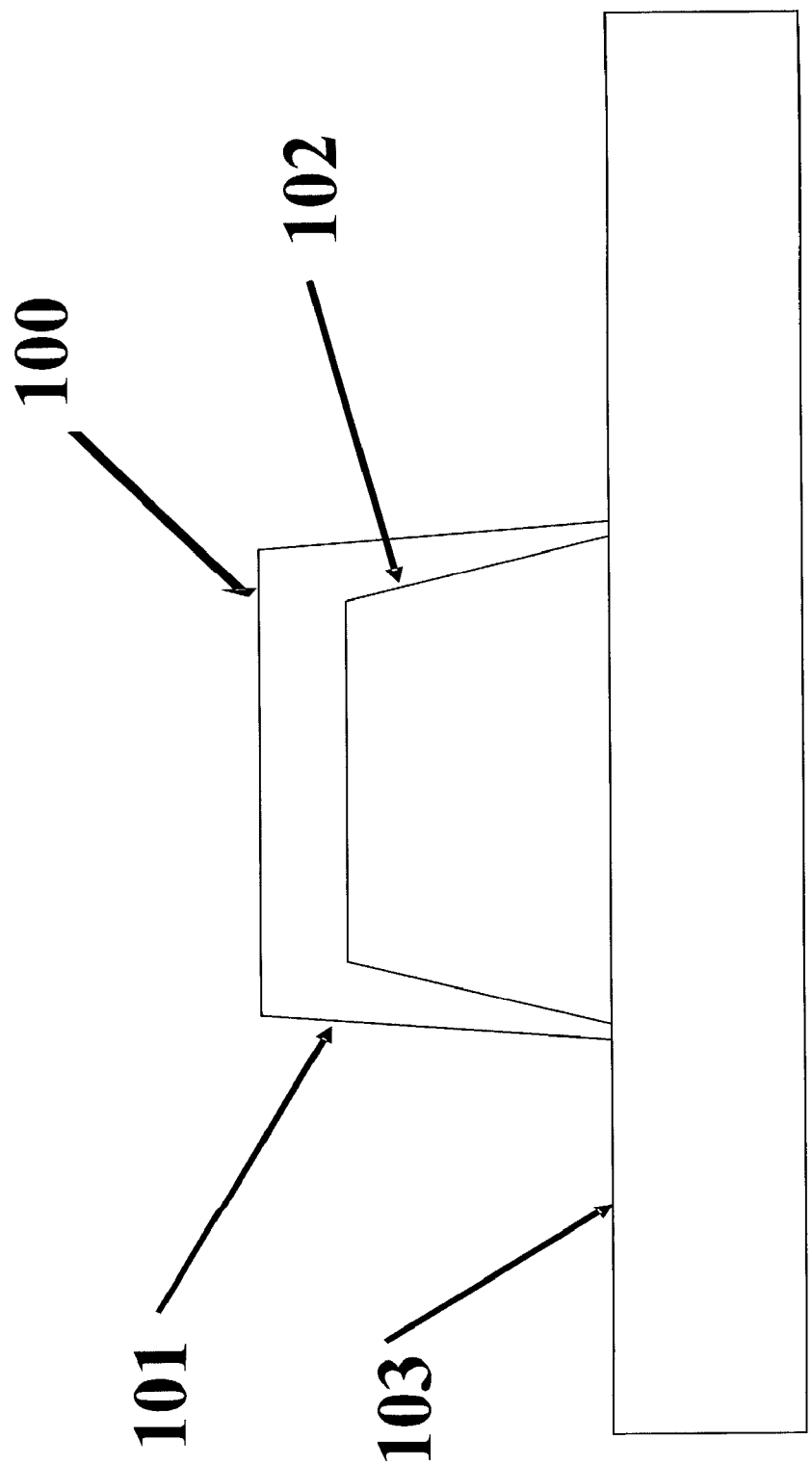
FIG. 1 is a diagrammatic representation of the cross section of a Photoresist pattern after it has been implanted by ions.

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein including alternatives, modifications and equivalents, as defined within the scope of the appended claims. It is noted that the drawings are not to scale and are diagrammatic in nature in a way that is thought to best illustrate features of interest. Further, like reference numbers are applied to like components, whenever practical, throughout the present disclosure. Descriptive terminology such as, for example, upper/ lower, top/bottom, and the like has been adopted for purposes of enhancing the reader's understanding, with respect to the various views provided in the Figures, and is in no way intended as being limiting.

In consideration of the foregoing information, based on Applicants' recent experiments, it has been identified that that a new method for elimination of surface damage is needed to permit acceptable levels of silicon loss from ultra shallow junctions. While the descriptions may be framed in terms of a wafer, it should be appreciated that any suitable workpiece or substrate can be employed.

As described in detail below, Applicants have discovered a remarkable method and associated structure to effectively eliminate such damage by applying to the surface of the wafer following high dose ion implantation—for every layer where ultra shallow junctions are exposed—a protective coating or coatings of polymer or other material which can be easily removed by dry or wet cleaning processes. Such a layer or layer structure can be applied so as to fill up less elevated areas of the wafer—generally between the implanted photoresist (PR) features. This material may be organic photoresist polymer, for example, which is not photosensitive and therefore is less costly. This material when applied to the wafer surface fills in the spaces above the ultra shallow junctions and covers and protects them.

Following the application of such a layer, as part of the method of this disclosure, a low temperature process for removal of the top and part of the sides of the implanted photoresist may be employed. This may be an anisotropic, ion based etching process using oxygen as the primary feed gas, if an organic polymer is used for the protective filling layer. If the filling material has any silicon content in addition to organic content, the etching process may employ a gas or mixture containing fluorine, which may also contain some oxygen. The etching process need not be completely anisotropic since it need not define any pattern. It therefore may be performed in any reactive ion etching (RIE) reactor, where the gas pressure may be up to ten or more Torr. In such cases, the ions still react with the exposed crust of the implanted photoresist and also activate the reaction of the gas phase radicals with the crust, as well as with the filler material that was applied to protect the ultra shallow junctions. Such etching should proceed at least until the etching process consumes the crust layer covering the top part of the implanted photoresist features. At this point the etching process may continue to etch the more normal photoresist within the crust and the filler material. In any case, however, the etching process should be stopped before either the photoresist or filler material layers are etched through to the underlying ultra shallow junctions, or other sensitive structures that will make up the transistor.

After the ion-based etching, a thermally activated dry stripping process may be employed in a second step to remove the remaining photoresist and filler. However, such process, should it be used to etch through the photoresist or filler to the underlying layer, should be an especially soft process that does not damage, oxidize or etch too much of the sensitive silicon of the ultra shallow junctions. Such a process could be a dry stripping process using a non-oxidizing feed gas—such as a mixture of hydrogen and nitrogen. Following such second step, a third and further step to clean the remaining photoresist and filler and or inorganic residues may be performed. Such a third step may be a water rinse or a chemical clean or a cryogenic spray technique or any other soft method that substantially completely removes the remaining residues from the photoresist.

Figure 3:
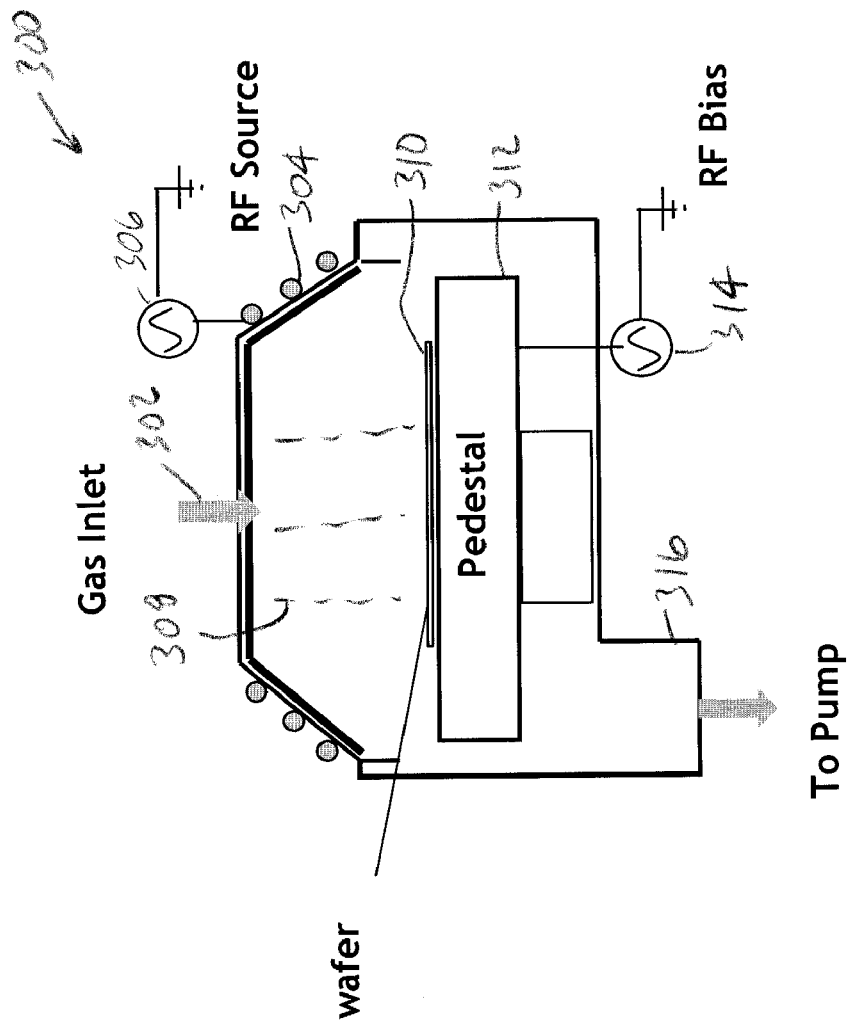
FIG. 3 is a diagrammatic representation, in elevation, of a dry etch system, or a reactive ion etch (RIE) system.

One embodiment of a dry etch system is diagrammatically illustrated in FIG. 3 and generally indicated by the reference number 300. It is noted that this system may be employed to advantage for any of the procedures described below that call for a dry etch system. System 300 includes a gas inlet 302 which provides gas to a plasma source 304, powered by an RF source 306. A plasma 308 is produced to which a wafer 310 or other suitable workpiece is exposed. The wafer is supported on a pedestal 312 to which an RF bias 314 can be applied for purposes of accelerating ions in plasma 308. A pump (not shown) is connected to an exhaust channel 316. It is noted that this system will be familiar to one having ordinary skill in the art.

FIG. 4 illustrates one embodiment of a method for effective photoresist removal following an ion implantation, generally indicated by the reference number 400. Step 401 denotes the start of the process, which begins at completion of the ion implantation process. In some embodiments, the photoresist will have been subjected to high dose ion implantation with ion dose above 10 to power 15 ions per square centimeter. At this step, the wafer or wafers with the PR (Photoresist) implant pattern have already been ion implanted (i.e., exposed to an ion implantation source) and are ready to go through the next step of the process wherein the photoresist is removed or stripped off. In a typical strip process scheme, after ion implantation, the wafer can be taken to the strip system to be stripped. However, in accordance with the present disclosure, a wafer is subjected to an intermediate step (that is, a step between completion of ion implantation and beginning of stripping). Step 402 serves as this intermediate step and follows directly after the completion of ion implantation. In step 402, a protective layer is deposited onto the wafer. The protective layer should be deposited so as to cover the exposed source/drain regions in the pattern, or other particularly damage or oxidation sensitive regions such as the gate electrode or others. The protective layer can be an organic polymer (such as, for example, Barrier Anti Reflecting Coating—BARC), or any other polymer that may also contain trace minerals such as silicon, or any non-polymeric material. The protective layer may be deposited onto the wafer using spin-on techniques, vapor deposition, or any other suitable method of forming coatings so long as, following the deposition, the protective layer covers the desired, formerly exposed areas (i.e., the areas that are to be protected) generally to a greater depth than the protective layer covers the top of the implanted photoresist. For example, one might deposit a material by CVD process and then re-flow the material at a temperature less than about 120 Celsius so that it preferentially fills the lower spaces—typically not already covered by photoresist and, of course, at least partially filling the apertures in the photoresist. The protective layer material should not significantly adversely affect the PR or the devices on the wafer. As will be seen, the height of the deposited protective layer material can be less than, equal to, or greater than the height of the photoresist pattern, though it may not cover the tops of the implanted photoresist by a great amount (>~1000 Angstroms). After deposition of the protective material, the PR and the deposited protective layer may be stripped using a dry removal (Step 410) or a wet etch system (Step 420) for any of the steps in the photoresist removal process, so long as the processes in the step(s) used to penetrate the top of the implanted photoresist are sufficiently selective to avoid also exposing the sensitive areas as the implanted "crust" of the photoresist is being removed.

The hard carbon "crust" of the implanted PR and the protective layers not immediately adjacent to the sensitive surfaces of the wafer may be removed somewhat concurrently. A difference in removal rate between the PR and the deposited layer can be tolerated; however, this difference should not be too large so that the protective layer material can be etched through at any location on the wafer while the hardened crust of the photoresist is being penetrated. If dry removal regime methods are employed, the initial hard "crust" layer of the PR can be removed using a dry etch (Step 412) or using a dry strip system (Step 411). Halogen or non-Halogen containing gasses can be used in the dry removal process. For example, a mixture of fluorocarbon, hydrogen-containing, nitrogen-containing, and oxygen chemistries may be used. Fluorine containing chemistries can aid in removal of the sputtered silicon. Hydrogen can help to volatilize the implanted species and the oxygen chemistry can etch the carbon and hydrocarbon backbone of the PR. Any suitable combination of fluorinated, oxygen, nitrogen, and hydrogen gases may be used to etch the PR and the protective layer. Specific chemistry combinations and mixtures, and cooperatively specific temperatures and plasma conditions may be used to ensure that the crust of the implanted PR and the protective layers, except the protective material immediately adjacent to the sensitive areas, are removed sufficiently concurrently. Note that one benefit resides in allowing for the use of any suitable type of chemistry and plasma conditions during removal of the crust of the implanted PR, as the surface of the wafer is protected during its removal by the protective layer. In general, if the crust of the implanted PR and the protective layer are to be removed using dry removal methods, they can be removed using a dry etch system (Step 412) or a down stream dry strip system (Step 411), so long as the above requirements are met. If a dry etch system is employed, the crust and even much of the bulk of the implanted PR and the protective layers can be simultaneously etched in a biased etcher using ion-assisted etching so long as the photoresist or protective layer covering sensitive areas is not breached. In this dry etching method, ions are created and utilized to Reactive Ion etch (RIE) the implanted photoresist crust and in some embodiments also some part of the bulk photoresist as well as some of the protective layer material where it is exposed. Any combination of Halogen and non-Halogen gases can be used to perform this etching. This etching may be performed at temperatures that are low enough (less than approximately 120 degree C.) to minimize any chances of blistering or "popping" of the implanted Photoresist. The PR and the protective layer may be etched partially in this step. In one embodiment, the PR and the protective layer may be etched until only a very thin layer of the two films is left on the wafer. If this method is used, aggressive chemistries can be employed to remove the implanted PR and the protective layer during the first or other early steps of the process. Once the films are etched to the desired remaining film thickness, the remaining film layers may subsequently be stripped in a down stream dry strip system (Step 411) or a wet etch system (413).

Figure 2:
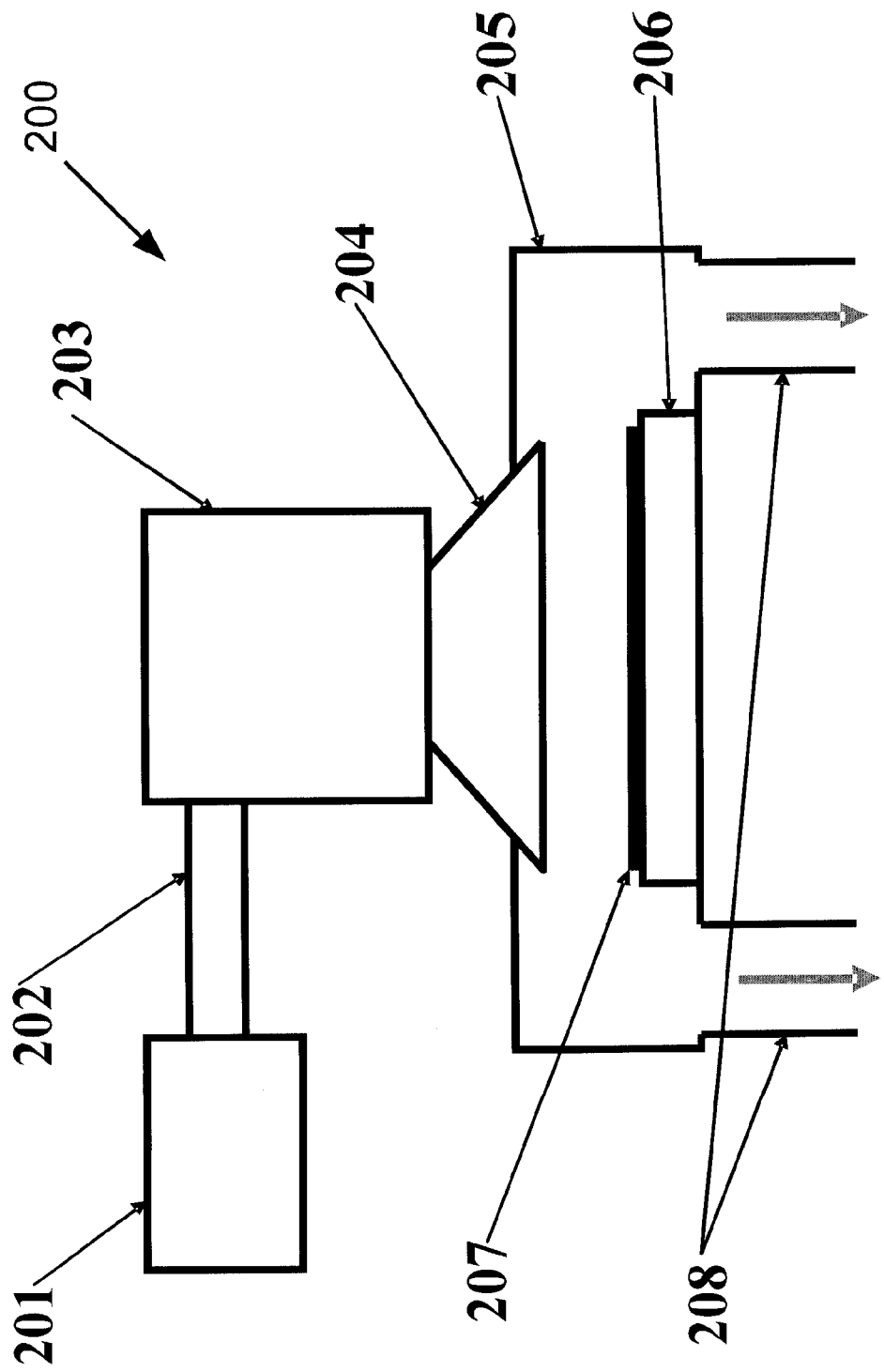
FIG. 2 is a diagrammatic representation, in elevation, of a down stream dry strip system according to the prior art, but which is adapted in accordance with the present disclosure, as is described in detail below.

In another embodiment, the PR and the protective layer may be etched in their entirety in the dry etch system so long as ion bombardment is terminated prior to penetrating the photoresist or protective layers covering any sensitive areas. It is noted that different plasma conditions and chemistries may be used in different steps of the process, as the PR and the protective films are being removed. For example, in one embodiment, three different recipes may be used sequentially to strip the PR and the protective layer in their entirety. The first recipe step can be optimized for removal of the top ion implanted layer of the PR crust which is highly carbonized and contains a relatively large amount of the implanted species. The first step may be optimized to provide an etching rate selectivity of approximately 1:1 between PR crust and the protective layer. Thus, the protective layer should not be etched much faster than is the crust of the PR. The second recipe step may be optimized for removing the bulk or non-implanted part of the PR as well as the protective layer at high rates (to achieve high throughput), while maintaining the approximate selectivity of 1:1 between the bulk PR and the protective layer. The final step of the recipe may be optimized to remove the final layer of the PR and the protective layer. This recipe step may be optimized to minimize any damage to the underlying devices or sensitive areas of transistors or other structures, once the PR and the protective films have been completely removed and the active device layers are exposed. As per Step 411, the crust of the implanted PR and the protective layer can be removed in a down stream dry strip system. In a down stream dry strip system, mostly gas-phase radicals are used to chemically react with and remove the films. An example of a dry strip system is shown in FIG. 2 and described above, and is adapted to perform the procedure currently under discussion. In one embodiment, the removal of the crust of the implanted PR and the protective layer may take place immediately after step 402. In another embodiment, the down stream dry strip system may be used immediately after step 412. Any suitable combination of Halogen and non-Halogen gases can be used to perform the film removal of step 411. Furthermore, the PR and the protective layer may be removed partially or completely in step 411. In one embodiment, the PR and the protective layer may be etched until a very thin layer of the two films remains on the wafer. If this latter embodiment is used, aggressive chemistries can be employed to remove the PR and the protective layer during this first step of the process wherein the crust and top part of the protective layer are removed.

Once the films are stripped to the desired remaining film thickness, the remaining film layers may subsequently be stripped in a wet or cryogenic spray etch system (Step 413) which can be performed with chemicals or processes that do not significantly damage the sensitive areas. In another embodiment, the PR and the protective layer may be stripped in their entirety in the dry strip system. It is important to note that different plasma conditions and chemistries may be used in different steps of the process as the PR and the protective films are being removed. For example, in one embodiment, three different sequential recipes may be used to strip the PR and the protective layer in their entirety. The first recipe step can be optimized for removal of the top layer, crust of the PR, which is highly carbonized and contains a relatively large amount of the implanted species. The first step may be optimized to provide an etching rate selectivity of approximately 1:1 between the PR crust and the protective layer. Since it is generally preferable for the crust to be etched faster than the protective layer, one may use protective materials made up of two or more discreet layers, for example, where the top layer contains substantial amounts of silicon. In this case, the initial feed gas may be primarily oxygen so that the crust will etch much faster than the protective layer. When the crust etch is sufficiently completed the gas can be changed to contain more fluorine which will etch the remaining silicon containing layer of the protective material. The second recipe step may be optimized for removing the bulk of the non-implant damaged PR as well as some of the protective layer at high rates (to achieve high throughput), while maintaining the selectivity of 1:1 between the bulk PR and the protective layer. Such rapid stripping may be performed with an oxygen-based gas mixture, if the protective material is mainly organic polymer or carbon-based. The final step of the recipe may be optimized to remove the remaining mostly non-implanted bulk PR and the protective layer. This recipe step should be optimized to minimize any damage to the underlying devices or sensitive materials once the remaining bulk PR and the protective films have been completely removed.

Following the partial or complete removal of the PR and the protective layer, the wafer may be treated in a wet etch system. This step of the process can be used to remove a finite thickness of films that were purposely left after process steps 411 or 412. In some cases, it may be desirable to leave a finite thickness of the PR and protective layer on the wafer at completion of steps 411 or 412. This can be used in cases where it is undesirable for the plasma from the dry strip or etch processes to contact the surface of the active areas of the wafer. Yet in another case, the PR and the protective layers may be removed entirely in steps 411 or 412. In this case, step 413 would serve to remove any remaining residues or inorganic ash that may be left on the wafer.

In another embodiment, Step 420 may be performed immediately after deposition of the protective layer in Step 402. If this embodiment is pursued, the implant and bulk PR, as well as the protective layer may be stripped in their entirety in the wet etch system using multiple steps that use different chemistries. It is noted that different chemistries may be used in different steps of the process as the PR and the protective films are being removed. For example, three different sequential steps with different chemistries may be used to strip the overall PR and the protective layer in their entirety. The first recipe step can be optimized for removal of the top, crust layer of the PR, which is highly carbonized and contains a relatively large amount of the implanted species. The first step can be optimized to provide an etching rate selectivity of approximately 1:1 between PR crust and the protective layer. The second recipe step may be optimized for removing the non-implanted bulk of the PR as well as the protective layer at high rates (to achieve high throughput), while maintaining the selectivity of approximately 1:1 between bulk PR and the protective layer. The final step of the recipe may be optimized to remove any final, remaining layer of the PR and the protective layer. This recipe step may be optimized to minimize any damage to the underlying devices, once the PR and the protective films have been completely removed, and the active device layers are exposed. One type of wet chemical that may be useful to remove the remaining PR and organic protective layer may be organic solvents. Typically such solvents include, for example, acetone, MEK, TCE and other aggressive solvents that will not oxidize or etch the silicon or other sensitive structures.

One aspect resides in the deposition of the protective layer, as shown in Step 402. The protective layer may be deposited so as to primarily cover the exposed active device regions in the pattern, which may be referred to as implant regions. FIG. 5a diagrammatically illustrates an exemplary cross section of a semiconductor transistor, generally indicated by the reference number 500. This semiconductor transistor is comprised of a gate 502, a gate dielectric layer 503, and source/drain regions 504, as the active device regions. A photoresist layer 506 is patterned on the device to serve as an ion-implantation mask. Source/drain regions 504 are implanted during the implantation process via an aperture 508, defined by the photoresist pattern, with relatively high doses of dopant species such as arsenic, phosphorus, and boron. The implanted dopant species do not penetrate the PR in its entirety. As a result, two distinct regions of PR are present after the implantation. After ion implantation, an upper surface and side surfaces of PR layer 506 are converted to a region 506a that contains mostly cross-linked carbon and implanted species (as described earlier). The interior region of the PR in which the dopant species have not penetrated remains unchanged and is denoted as region 506b.

FIG. 5b, illustrates a cross section of the transistor after the application of a protective layer 510. In this Figure, it can be seen that after deposition of the protective layer, active source/drain device regions (especially for Ultra-Shallow Junctions) that were previously exposed have been completely covered. Protective layer 510 can be an organic polymer (such as Barrier Anti Reflecting Coating—BARC), or any other polymer that may contain trace minerals such as silicon, any non-polymeric material, or any combination of a polymeric and non-polymeric materials. Some desirable properties of protective layers include: low cost, an ability to flow easily into very small openings such as the source and drain regions of integrated circuits with critical dimensions less than or about 45 nm, ease of selective removal by specific, very soft processes either wet or dry, and lack of reactivity with either silicon, silicon dioxide or other materials that are found on wafers at such stage of manufacture.

Some embodiments may involve the deposition of a single protective layer (as seen in FIG. 5b). That is, the layer is made up of one material. This protective layer may be selected in accordance with its etching properties. As mentioned earlier, the protective layer is later simultaneously removed along with the PR pattern areas. Therefore, it may be desirable to select a protective layer that has similar etching properties as that of the implanted PR mask. In other words, it may be desirable to select a protective layer that has an etching selectivity relative to that of the crust of the PR close to one-to-one. Other embodiments may involve the use of two different material layers in order to achieve more optimum characteristics for the protective layer. Whether one or two materials is used as the filler material, the thickness of the filler material, in the apertures that surround the active device regions, can be customized in view the particular removal mechanism that is employed to ensure that some portion of the filler material remains in the apertures as the implant crust is removed, so that the remaining portion of filler material protects the active device regions from the most aggressive portion of the overall PR removal process during which the implant crust is removed.

Figure 6:
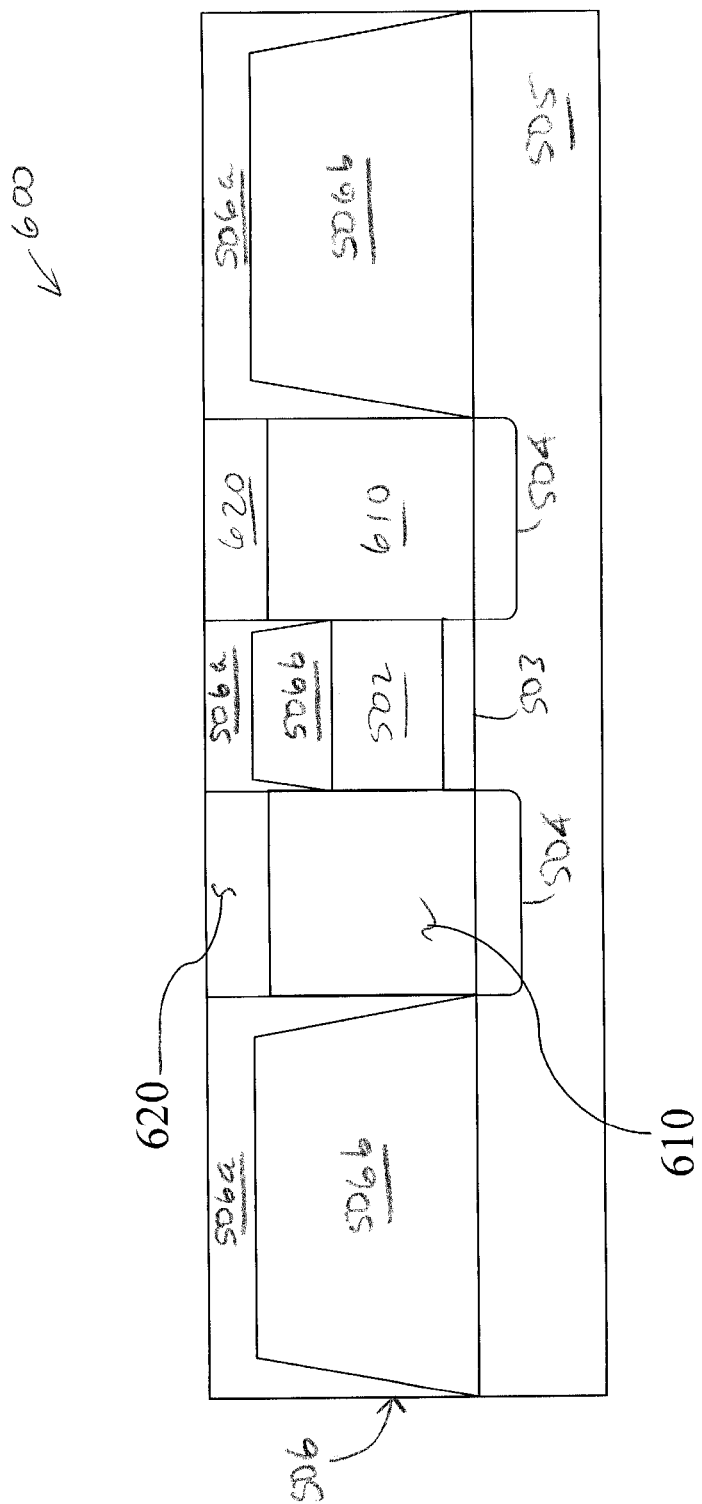
FIG. 6 is a diagrammatic representation, in elevation, of the cross section of wafer and associated layers after deposition of two protective layers.

FIG. 6 illustrates another embodiment, generally indicated by the reference number 600, where two different, protective layers have been deposited, with one layer deposited subsequent to the other. In this case, a bottom, first protective layer 610 may be a polymer with etch properties that are similar to that of the original PR layer (un-implanted PR). The material for bottom protective layer 610 may be, for example, the same type of photoresist from which the implant crust and bulk photoresist are formed, or any non-photoactive polymer such as BARC. On the other hand, an upper, second protective layer 620, of this overall protective layer structure, may be a different material than the photoresist, but with etch properties that are more similar to those of the regions of the PR that have been directly exposed to the implant species (mostly the top layer of the PR). Because the implanted regions of the PR are comprised of a cross-linked carbon layer, which also contains the implanted species, these regions etch more slowly than the original un-implanted PR. In this case, upper layer 620 of the protective layer structure may be a silicon containing BARC or silsesquioxane or other material which can have an etch selectivity of roughly 1:1 relative to that of implanted PR, when an appropriate gas mixture is used. If pure oxygen is used, then the crust may etch much faster, whereas, if a heavily fluorinated gas mixture is used, the protective layer may etch faster than the crust. The two protective layers may be deposited onto the wafer, for example, using spin-on techniques, vapor deposition, or any other suitable technique for depositing coatings so long as the layers preferentially fill the open areas above the sensitive surfaces of the wafer. The protective layer or layers do not adversely affect the PR or the devices on the wafer. Finally, a final height of the deposited material can be less than, equal to, or greater than the height of the Photoresist pattern, though preferably not excessively above the implanted PR features. The necessary height of the protective layer may be selected to ensure that the best etching selectivity and conditions are achieved when the PR and the protective layers are etched simultaneously.

Figure 7:
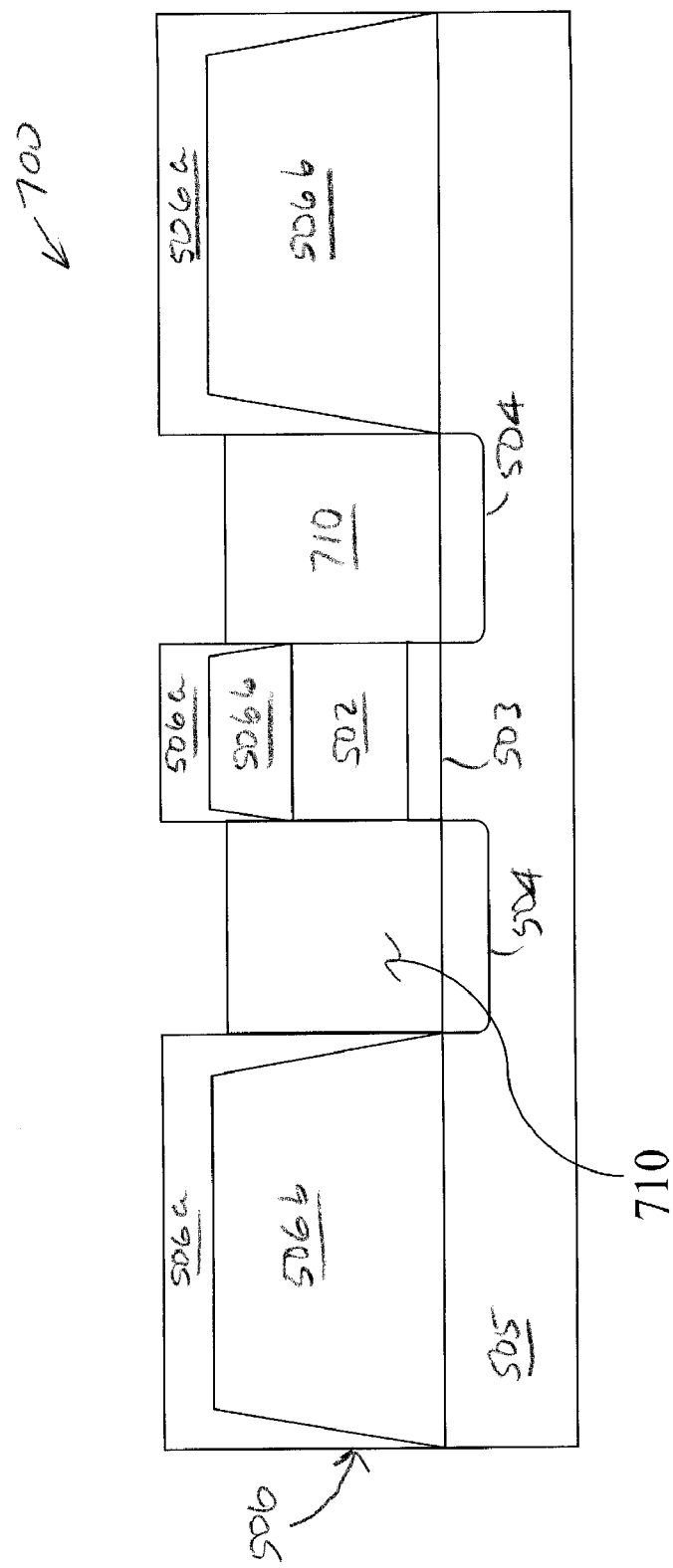
FIG. 7 is a diagrammatic representation, in elevation, of the cross section of wafer and associated layers after deposition of a protective Layer with a height lower than that of the PR.
Figure 8:
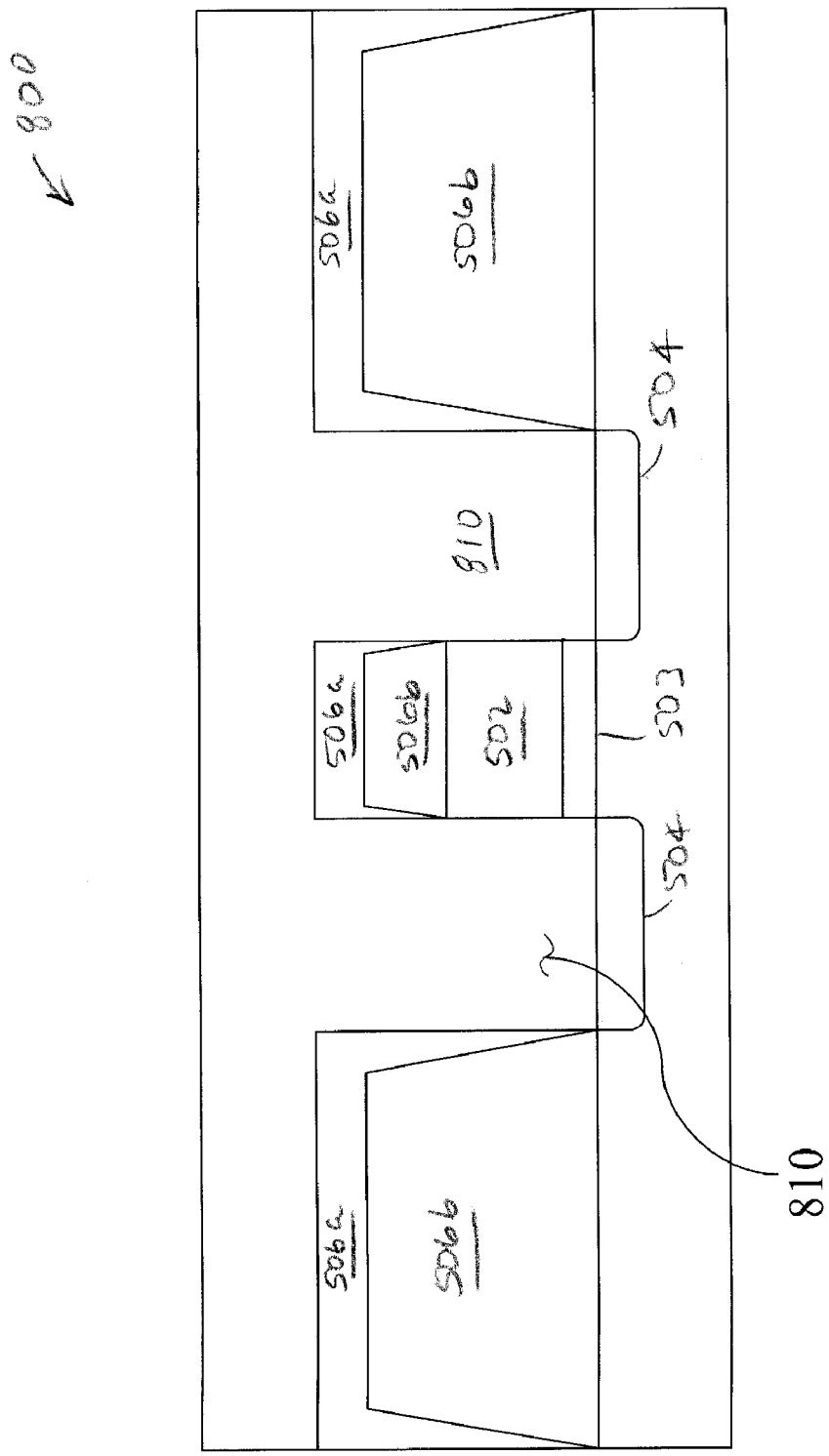
FIG. 8 is a diagrammatic representation, in elevation, of the cross section of wafer and associated layers after deposition of a protective Layer with a height higher than that of the PR.

FIG. 7 illustrates an embodiment, generally indicated by the reference number 700, where a protective layer 710 is thinner than the overall height of the PR regions. FIG. 8 illustrates an embodiment, generally indicated by the reference number 800, where a protective layer 810 is deposited in such a way that it covers the wafer in its entirety, including the areas of the PR pattern. It should be noted that in all of the figures the protective layer covers the surface much as a liquid would—having a nearly common top surface at all places on the wafer. In some cases, where the sensitive structure (such as, for example, a gate electrode) to be protected is actually relatively above other sensitive areas the protective layer may be somewhat taller than the structure being protected so that the protective layer may be sufficiently thick above the sensitive structure to allow the surrounding crust to be breached before the protective layer.

Figure 9:
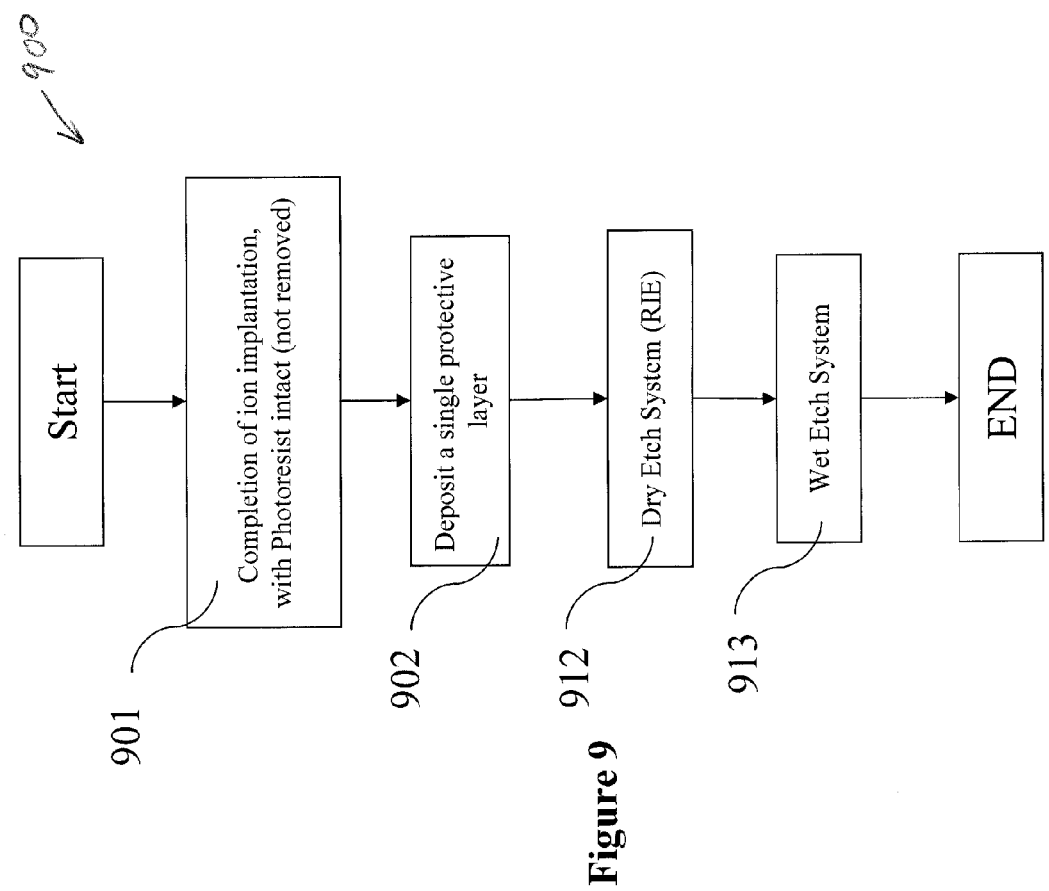
FIG. 9 is a flow diagram that illustrates process steps that can be followed in accordance with one embodiment.

As should be noted, in view of the flow chart shown in FIG. 4, many embodiments are possible in view of the concepts described herein, depending on what steps are undertaken for the removal of the PR and the protective layer. One embodiment is shown in FIG. 9 and generally indicated by the reference number 900. In this embodiment, after completion of the ion implantation Step 901, a single layer of protective material can be deposited on the wafer. That is, one type of material. The protective layer should be deposited so as to cover the exposed source/drain regions of the semiconductor device. The protective layer can be a polymer (such as PR, or Barrier Anti Reflecting Coating—BARC), any other polymer that may contain trace minerals such as silicon, or any non-polymeric material. The protective layer may be deposited onto the wafer, for example, using spin-on techniques, vapor deposition, or any other technique for depositing coatings, so long as the protective layer fills the volume above the areas to be protected. The cross section of the transistors, after deposition of the protective layer, may be analogous to, but not limited to what is shown in FIG. 5b, with the protective layer denoted as 510. After deposition of the protective layer, the wafer can be etched in a dry etch system 912, analogous to but not limited to the chamber shown in FIG. 3. In this case a dry etch chamber can be used because it can effectively and simultaneously sputter etch the implanted PR crust and the protective layer at low temperatures (to minimize or eliminate chances of popping) as well as providing a selectivity of PR to protective layer of approximately 1:1. Different processing steps may be used in the dry etch system in removal of the PR and the protective layer. For example, one method for removal of the PR and the protective layer can be to apply three different recipes sequentially. The first recipe step can be optimized for removal of the top layer of the PR, which is highly carbonized and contains a relatively large amount of the implanted species. The first step may be optimized to provide an etching rate selectivity roughly 1:1 between the PR crust and the protective layer. The second recipe step may be optimized for removing the bulk, non-implanted PR, as well as the protective layer at high rates (to achieve high throughput), while maintaining the etch rate of the bulk PR greater than that of the protective layer. The final step of the recipe may be optimized to remove any final layer of the PR and the protective layer. This process step may be optimized to minimize any damage to the underlying device regions, once the PR and the protective films have been completely removed and the active device layers are exposed to the dry etch process. This minimum damage step avoids energetic ion bombardment or any chemical content that would attack or damage the sensitive device layers. Following Step 912, any remaining residue on the wafer may be removed in a wet etch system 913. It is noted that FIG. 5b illustrates one possible cross section of a transistor during the manufacturing process. The application of this invention is not limited to the devices in the cross sections shown and this protective layer may be used to protect any exposed layer on the wafer during removal of the resist that has been immediately previously implanted.

Figure 10:
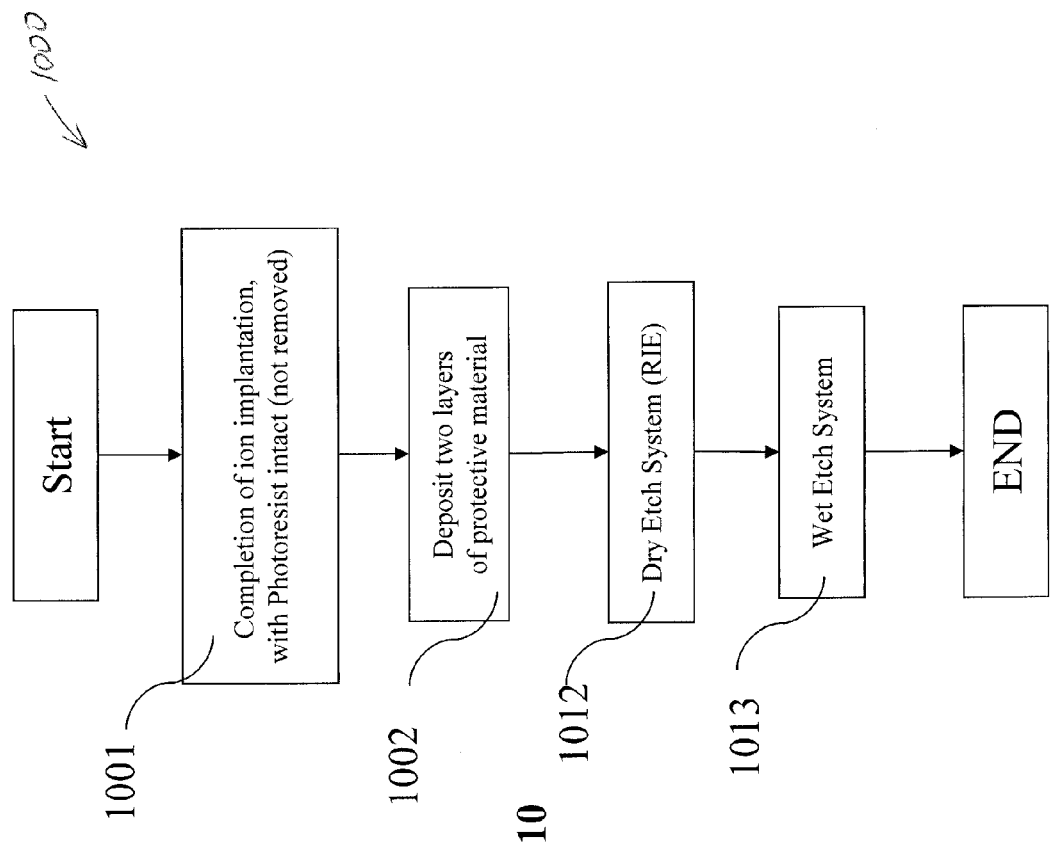
FIG. 10 is a flow diagram that illustrates process steps that can be followed in accordance with another embodiment.

Another embodiment is shown in FIG. 10, generally indicated by the reference number 1000. In this embodiment, after completion of an ion implantation step 1001, two distinctly different protective layers can be deposited onto the wafer. The protective layers can be deposited to cover the exposed source/drain regions in the pattern. In this case, the bottom layer of the protective material may be a PR material or an organic polymer with etching properties that are very similar to that of bulk PR. The upper layer of the protective material can be selected to be capable of etching characteristics similar to the cross linked crust PR. The material for the upper layer of the protective material, for example, may be a silicon containing PR or a silicon containing BARC. The cross section of the transistors, after deposition of the protective layer, may be analogous to, but is not limited to what is shown in FIG. 6, with the bottom protective layer denoted as 610 and the top protective layer denoted as 620. After deposition of the protective layer, the wafer can be etched in a dry etch system, analogous to but not limited to the chamber shown in FIG. 3. For example, one method for dry etching of the crust of the PR and the protective layer can be to perform the two different recipes sequentially. The first recipe step may be comprised of primarily 02 and Hydrogen containing chemistry, optimized for removal of the top layer (crust) of the PR, which is made of a cross linked carbon polymer and implanted dopant species. The first step can be optimized by the addition of fluorine containing gas to provide an etching rate selectivity of roughly 1:1 between PR crust and the protective layer. The second recipe step may be optimized for removing the remaining bulk PR, the silicon containing sidewalls of the PR, as well as the protective layer, at approximately the same rates. The second step of the recipe may be optimized to remove what remains of the PR and the protective layer, after the first step. This recipe step may be comprised, for example, of $O_2$ and tetrafluoromethane gases. This step can effectively remove the bulk PR, the PR crust on the side walls, the silicon that may have been sputtered onto the sidewalls of the PR crust, as well as the protective layer. Furthermore, this second recipe step can be terminated to minimize any damage to the underlying device regions, before the PR and the protective films have been completely removed and the active device layers are exposed to the dry etch process. Following Step 1012, remaining PR and residues on the wafer may be removed in a wet etch system 1013 using a very soft chemical or mixture. It is noted that FIG. 6 illustrates one possible cross section of a transistor during the manufacturing process. Furthermore, the application of this invention is not limited to the devices shown in the cross sections and this protective layer may be used to protect any exposed layer on the wafer during removal of the resist that has been immediately previously implanted.

Figure 11:
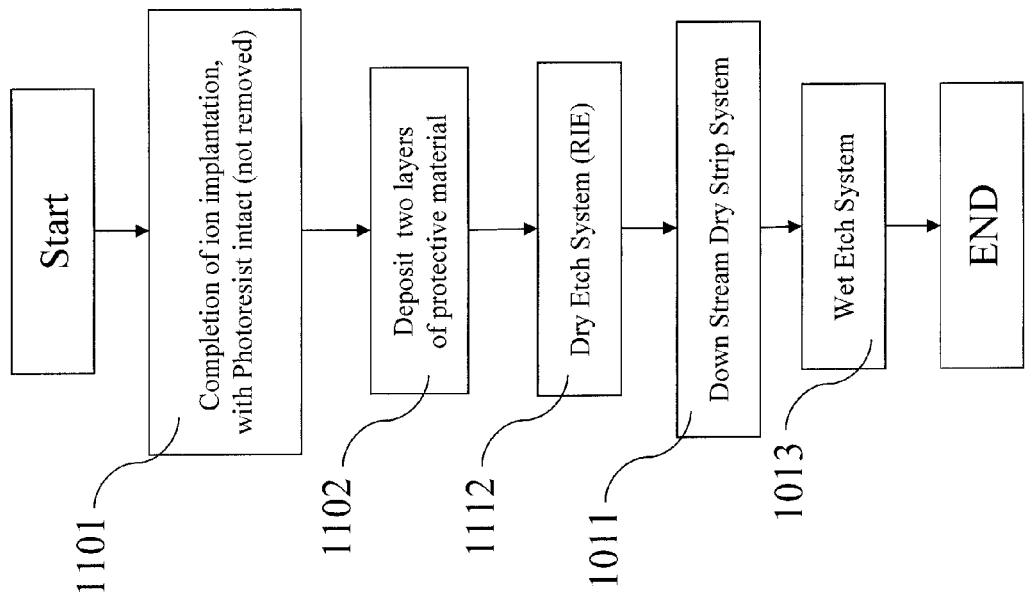
FIG. 11 is a flow chart that represents the process steps that can be followed in yet another embodiment.

Another embodiment is shown in FIG. 11 and generally indicated by the reference number 1100. In this embodiment, after completion of the ion implantation in Step 1101, two distinctly different protective layers can be deposited onto the wafer. The protective layers can be deposited in such a way to cover the exposed, sensitive regions in the pattern such as, for example, source/drain regions. In this case, the bottom layer of the protective material may be a PR material or a polymer with etching properties that are very similar to that of PR. The upper layer of the protective material can be selected to have etching characteristics similar to the cross linked crust PR. The material for the upper layer of the protective material may be, for example, a silicon containing PR or a silicon containing BARC. The cross section of the transistors, after deposition of the protective layer, may be analogous to, but is not limited to what is shown in FIG. 6, with the bottom protective layer denoted as 610 and the top protective layer denoted as 620. After deposition of the protective layers, the wafer can first be etched in a dry etch system 1112, analogous to but not limited to the chamber shown in FIG. 3. For example, one method for dry etching of the PR and the protective layer can be to apply a chemistry comprised of primarily $O_2$ and Hydrogen gases, optimized for removal of the top layer (crust) of the PR, which is made of a cross linked carbon polymer and implanted dopant species. The process step may be optimized to provide an etching rate selectivity greater than 1:1 between PR crust and the protective layer. The second recipe step may be optimized for removing the bulk PR, the silicon containing sidewalls of the PR, as well as the protective layer. Following dry etching, the wafer can be processed in a down stream dry strip system 1111, analogous to what is shown in FIG. 2, to remove the remaining PR and protective layers. This process step may utilize hydrogen and nitrogen gases. This step can effectively remove the remaining bulk PR, and the PR crust on the side walls while also chemically degrading the silicon that may have been sputtered onto the sidewalls, as well as etching the protective layer at high rates (high throughput). Furthermore, this second step can be optimized to minimize any damage to the underlying device regions, once the PR and the protective films have been completely removed and the active device layers are exposed to the dry etch process. Following Step 1111, any remaining residue on the wafer may be removed in a wet etch system 1113. It is noted that FIG. 6 displays one possible cross section of a transistor during the manufacturing process. Furthermore, the application of this invention is not limited to the devices shown in the shown cross sections and this protective layer may be used to protect any exposed layer on the wafer during removal of the resist that has been immediately previously implanted.

The protective layer or at least one layer in a set of layers may in some embodiments be composed, at least in part, of a "spin on Carbon" material or spin on carbon containing material which is desirable because such material can have a selectivity in etching rate close to one-to-one with the crust of the implanted photoresist.

The foregoing description of the invention has been presented for purposes of illustration and description. It is not intended to be exhaustive or to limit the invention to the precise form disclosed, and other modifications and variations may be possible in light of the above teachings wherein those of skill in the art will recognize certain modifications, permutations, additions and sub-combinations thereof.

What is claimed is:

1. In a system at least for use in removing an implant crust that is formed as an outermost layer of photoresist in a photoresist pattern that is supported by a treatment object and which photoresist pattern defines a plurality of apertures each of which includes a sidewall that leads to an active device region of said treatment object, said active device region being formed responsive to exposure of the treatment object to an ion implant which introduces an implanted dopant into the active device region of the treatment object as well as into the photoresist, thereby producing said implant crust, and said implant crust being formed on said sidewall as well as on an uppermost, laterally extending surface of the layer of photoresist between the sidewalls of the apertures, a method comprising:

applying a filler material to said treatment object such that the filler material reaches a fill depth in each aperture;

exposing the treatment object and the filler material to a treatment environment such that at least said implant crust on said laterally extending surface of the photoresist is removed as the filler material protects said active device region of the aperture from said environment while at least a portion of the filler material is removed; and thereafter, removing a remaining portion of said photoresist layer.

2. The method of claim 1 wherein said exposing removes at least a top portion of the filler material from each aperture, as the implant crust is removed from said laterally extending surface, thereby leaving a bottom portion of the filler material in the aperture, which bottom portion protects said active device region from the treatment environment and, as part of said removing, uncovering the active device region by stripping the bottom portion of the filler material from the aperture.

3. The method of claim 1 wherein said implant crust is formed by a high dose ion implantation to form said implant crust as a high dose implant crust and said exposing removes the high dose implant crust on the laterally extending surface of the photoresist.

4. The method of claim 1 wherein applying said filler material to the treatment object places at least some of the filler material on the laterally extending surface of the photoresist and thereby said implant crust at a depth that is less than said fill depth of the filler material in said aperture and said exposing removes the filler material from the laterally extending surface before the filler material is removed from said aperture.

5. The method of claim 1 wherein applying includes spinning on said filler material.

6. The method of claim 1 wherein applying includes a vapor deposition of said filler material.

7. The method of claim 1 wherein applying includes forming said filler material by deposition and, thereafter, causing the filler material to reflow to fill said apertures.

8. The method of claim 1 wherein each aperture includes an aperture depth and the filler material fills each aperture to a level that is less than the aperture depth.

9. The method of claim 1 wherein each aperture includes an aperture depth and the filler material completely fills each aperture.

10. The method of claim 1 wherein applying includes causing said filler material to planarize on said treatment object to form a first thickness with respect to each aperture and a second thickness on top of the laterally extending surface of the photoresist such that the first thickness is greater that the second thickness.

11. The method of claim 1 wherein applying said filler material includes using a single material to form a plug in each aperture as a single layer of the single material.

12. The method of claim 1 including performing said exposing using a selected one or more of reactive ion etching, a down stream plasma and wet etching and performing said removing using one or more of a down stream plasma and wet etching.

13. The method of claim 1 wherein applying said filler material includes using a first material to form a bottom portion of the filler material in each aperture and, thereafter, using a second, different material to form a top portion of the filler material in said aperture on said bottom portion as parts of a plug structure in each aperture such that the first material includes a first removal rate when exposed to said treatment environment and the second material includes a second, different removal rate when exposed to said treatment environment.

14. The method of claim 13 including forming the top portion of the filler material layer to contain silicon.

15. The method of claim 14 wherein exposing uses a first plasma having a first plasma chemistry for removing said implant crust.

16. The method of claim 15 wherein exposing removes said implant crust at a higher etch rate than an etch rate at which said filler material is concurrently removed.

17. The method of claim 15 including using oxygen and a fluorine containing gas in said first plasma to remove the filler material and the implant crust to be removed at an equal etch rate while an implanted region is protected by the filler material in the aperture.

18. The method of claim 15 wherein exposing uses a second plasma having a second, different plasma chemistry where the first plasma uses reactive ion etching to remove the implant crust from the laterally extending surface of the photoresist and the top portion of the filler material from said aperture and said second plasma is used in a downstream stripping process.

19. The method of claim 15 wherein exposing uses a first plasma having a first plasma chemistry including fluorine for removing the top portion of the filler material, as well as the implant crust.

20. The method of claim 1 wherein applying includes using an organic polymer as said filler material.

21. The method of claim 1 wherein applying includes using BARC as said filler material.

22. The method of claim 1 wherein applying includes using silsesquioxane as said filler material.

23. The method of claim 1 wherein a given material is used as said photoresist and including using the given material as said filler material.

24. The method of claim 1 wherein exposing uses a plasma in said treatment environment to concurrently remove the implant crust and a top portion of the filler material.

25. The method of claim 1 wherein exposing uses a wet process in said environment to concurrently remove the implant crust on said laterally extending surface and on said sidewall, along with and said portion of the filler material.

26. The method of claim 1 wherein exposing uses a first plasma having a first plasma chemistry that is customized for removing said implant crust and said filler material with a selectivity of at least approximately one to one.

27. The method of claim 26 wherein exposing, after the use of said first plasma, uses a second plasma having a second plasma chemistry that is customized for removing a bulk photoresist that underlies the removed implant crust and the filler material with a selectivity of at least approximately one to one.

28. The method of claim 27 wherein said second plasma chemistry is further customized to limit damage to the active device region once the active device region is uncovered by the second plasma such that the active device region remains substantially intact.

29. The method of claim 26 wherein exposing, after the use of said second plasma, uses a third plasma that is customized for completing the removal of the photoresist and filler to uncover the exposed regions, while limiting damage to said exposed regions.

* * * * *